United States Patent
Daskalakis et al.

(10) Patent No.: US 12,295,203 B2
(45) Date of Patent: May 6, 2025

(54) WHITE ORGANIC LIGHT EMITTING DEVICE AND PROCESS FOR PRODUCTION THEREOF

(71) Applicant: TURUN YLIOPISTO, Turun Yliopisto (FI)

(72) Inventors: Konstantinos Daskalakis, Helsinki (FI); Päivi Törmä, Espoo (FI)

(73) Assignee: TURUN YLIOPISTO, Turun Yliopisto (FI)

( * ) Notice: Subject to any disclaimer, the term of this patent is extended or adjusted under 35 U.S.C. 154(b) by 751 days.

(21) Appl. No.: 17/599,804

(22) PCT Filed: Apr. 2, 2020

(86) PCT No.: PCT/FI2020/050214
§ 371 (c)(1),
(2) Date: Sep. 29, 2021

(87) PCT Pub. No.: WO2020/201633
PCT Pub. Date: Oct. 8, 2020

(65) Prior Publication Data
US 2022/0165992 A1    May 26, 2022

(30) Foreign Application Priority Data
Apr. 3, 2019   (FI) .................................. 20195269

(51) Int. Cl.
*H01L 51/52* (2006.01)
*H10K 50/17* (2023.01)
(Continued)

(52) U.S. Cl.
CPC ......... *H10K 50/852* (2023.02); *H10K 50/171* (2023.02); *H10K 71/00* (2023.02);
(Continued)

(58) Field of Classification Search
CPC ........................ H10K 50/125; H10K 50/852
See application file for complete search history.

(56) References Cited

U.S. PATENT DOCUMENTS

2008/0137008 A1   6/2008 Rogojevic et al.
2010/0303468 A1   12/2010 Mastro
(Continued)

FOREIGN PATENT DOCUMENTS

CN   100463244 C   2/2009
CN   104466026 A   3/2015
(Continued)

OTHER PUBLICATIONS

Notice of preliminary rejection and English translation thereof from Korean Intellectual Property Office in corresponding application KR 10-202-7036045, 17 pages.
(Continued)

*Primary Examiner* — Jaehwan Oh
(74) *Attorney, Agent, or Firm* — Meunier Carlin & Curfman LLC

(57) ABSTRACT

The present invention relates to a white organic light emitting device (WOLED) comprising an electroluminescent material (ELM) and a Bragg converter disposed adjacent to the ELM. In addition, the invention also relates to a method for producing white light using said WOLED, use of the WOLED for producing white light, and a process for producing said WOLED.

12 Claims, 2 Drawing Sheets

(51) Int. Cl.
*H10K 50/852* (2023.01)
*H10K 71/00* (2023.01)
*H10K 85/60* (2023.01)
*H10K 50/18* (2023.01)
*H10K 102/00* (2023.01)

(52) U.S. Cl.
CPC ....... *H10K 85/615* (2023.02); *H10K 85/6572* (2023.02); *H10K 50/18* (2023.02); *H10K 2102/00* (2023.02)

(56) References Cited

U.S. PATENT DOCUMENTS

| | | |
|---|---|---|
| 2011/0303905 A1 | 12/2011 | Gather et al. |
| 2012/0153320 A1 | 6/2012 | Gaertner et al. |
| 2014/0339514 A1 | 11/2014 | Oh et al. |
| 2015/0008419 A1* | 1/2015 | Li ................ H10K 85/346 257/40 |
| 2018/0219183 A1 | 8/2018 | Song |
| 2018/0241005 A1* | 8/2018 | Kim ................ H10K 71/00 |
| 2018/0248145 A1* | 8/2018 | Ihn ................ H10K 85/6572 |
| 2019/0229295 A1* | 7/2019 | Wang ................ H10K 59/878 |
| 2019/0355868 A1* | 11/2019 | Fimland ............ H01S 5/04253 |
| 2020/0075891 A1* | 3/2020 | Zhou ................ H10K 50/852 |
| 2021/0028383 A1* | 1/2021 | Manders ............ H10K 59/35 |

FOREIGN PATENT DOCUMENTS

| | | |
|---|---|---|
| CN | 108987609 A | 12/2018 |
| KR | 10-20140135560 A | 11/2014 |
| KR | 10-1586903 B1 | 1/2016 |
| KR | 10-20180090421 A | 8/2018 |
| WO | 2014039615 A1 | 3/2014 |
| WO | 2015167171 A1 | 11/2015 |
| WO | 2017051298 A1 | 3/2017 |

OTHER PUBLICATIONS

International Search Report and Written Opinion mailed Jul. 1, 2020 in PCT/FI2020/050214 (14 pages).
Jianhua Zhang et al, "Sunlight-like white organic light-emitting diodes with inorganic/organic nanolaminate distributed Bragg reflector (DBR) anode microcavity by using atomic layer deposition", Organic Electronics., vol. 33, Jun. 1, 2016 (Jun. 1, 2016), p. 88-94.
Lili Bao et al, "A Review of Single White-Light Emitters: The Quest for Picture Perfect Dyes in the Next Generation of Single Layer WOLED Displays", Mar. 1, 2014 (Mar. 1, 2014), <URL:https://www.ingentaconnect.com/content/ben/coc/2014/00000018/00000006/art00006#>.
Gubbin Christopher R et al, "Low-voltage polariton electroluminescence from an ultrastrongly coupled organic light-emitting diode", Jun. 9, 2014 (Jun. 9, 2014), vol. 104, No. 23, pp. 233302-1-pp. 233302-2.
International Preliminary Report on Patentability mailed Jun. 29, 2021 in PCT/FI2020/050214 (13 pages).
Finnish Search Report mailed Jun. 27, 2019 in Application No. 20195269 (2 pages).

* cited by examiner

WHITE ORGANIC LIGHT EMITTING DEVICE AND PROCESS FOR PRODUCTION THEREOF

CROSS-REFERENCE TO RELATED APPLICATIONS

This is a United States National Phase Patent Application of International Patent Application No. PCT/FI2020/050214, filed on Apr. 2, 2020, which claims the benefit of priority to FI 20195269, filed on Apr. 3, 2019, the contents of both of which are incorporated herein by reference in their entireties.

FIELD OF THE INVENTION

The present invention relates to a white organic light emitting device (WOLED) comprising an electroluminescent medium (ELM) and a Bragg converter disposed adjacent to the ELM. In addition, the invention also relates to a method for producing white light using said WOLED, use of the WOLED for producing white light, and a process for producing said WOLED.

BACKGROUND OF THE INVENTION

In the last three decades, light emitting diodes (LEDs) have been utilized in a plethora of optoelectronic applications and constitute one of the major trends in modern research. Owing to their significant impact on energy saving, LEDs have been established as versatile and highly efficient general lighting systems. In particular, light generation in organic light emitting devices (OLEDs) relies on electroluminescence from organic or organometallic molecules which have substantially lower cost compared with their inorganic counterparts. In addition to the low fabrication cost of OLEDs, the ease of their integration in large surfaces and flexible substrates renders them particularly attractive as glare-free lights which are also integrable with complex lighting design architectures.

One of the key requirements of general illumination devices is the emission of high-intensity and high-quality white-light which is color-stable at any given power input. Typically, methods for manufacturing white-emitting organic light emitting devices (WOLEDs) can be categorized in three main designs: 1) WOLED based on a single emitting layer (s-EML) structures in which white light is achieved via near-molecule energy transfer (Förster or Dexter) between a matrix material (single molecule or polymer) and multiple dopant emitters (e.g. blue-green-red). While these structures offer fabrication flexibility (vacuum deposition or solution processes), especially for research studies of WOLEDs, precise control of dopant concentration is one of the major challenges. 2) Stable electroluminescence and high device yields can be achieved in multiple emitting-layer WOLEDs. There, white light results from mixing red-green-blue (RGB) light from vertically stacked, multi-EML or striped structures. However, their fabrication as is complicated and their active area is thick which usually results in a high operating current. Moreover, an electronic driving circuitry is required to control the color combination from the multiple color layers. 3) Incorporation of multiple cavity modes in a thick active medium consisting of a single emitter (sometimes doped) that has broadband emission spectrum. The cavity mode resonance located at RGB wavelengths Purcell-enhance emission at RGB. The advantage in these photonic multiresonant structures is that they can be designed to utilize EML from any of the previously discussed categories. The main challenge here is the increased cavity length, usually thicker than 380 nm, which introduces additional lossy waveguided modes and impedes efficient electron-hole recombination in the OLEDs (efficiency roll-off).

U.S. Patent Application Publication No. 2008/0137008 teaches devices with three stacked layers, where each layer has a multiplicity of pixels, one third of which is emissively active for a chosen color, but where upon proper alignment of the three layers the color pixels of one layer align vertically with inactive pixels of the other layers. The layers could be independently addressed to provide color temperatures from about 5500 K to about 6500 K, or about 2800 K to about 5500 K.

U.S. Patent Application Publication No. 2012/0153320 teaches a light emitting device where two or three alternating stripes of different color electroluminescent OLEDs are constructed for microcavity effects such that the device can have enhanced light output.

BRIEF DESCRIPTION OF THE INVENTION

It was surprisingly found that white light can be generated from a top-emitting OLED (TOLED) comprising a single emitting layer (s-EML) coupled to the photonic Bragg modes of a dielectric distributed Bragg reflector (DBR). It was also found that Bragg modes with resonances at the main white light colors, red-green-blue (RGB), can modify the spectrum of the s-EML and produce broadband white light emission.

Advantages of the present invention include the simplification of the structure of white light emitting OLEDs and that said WOLEDs can be manufactured easily and cost-effectively on an industrial scale.

The first aspect of the present invention is a white organic light emitting device (WOLED). According to the invention, it comprises an electroluminescent medium (ELM) and a Bragg converter disposed immediately adjacent to the ELM. Said WOLED can be used for producing white light.

The second aspect of the present invention is a process for producing said WOLED. According to the invention, said process comprises the steps of
a. sequentially depositing the anode and hole injecting layers through a patterned shadow mask,
b. sequentially depositing the light emitting layer, the hole blocking layer, the electron injection layer, and the cathode layer through a patterned shadow mask, and
c. direct sputtering of the Bragg converter layers onto the surface of the cathode through a patterned shadow mask.

The third aspect of the present invention is a method for producing white light using the WOLED described here.

The fourth aspect of the present invention is use of the WOLED described here for the production of white light.

The objects of the invention are achieved by the device, the process, the method, and the use characterized by what is stated in the independent claims. The preferred embodiments of the invention are disclosed in the dependent claims.

DETAILED DESCRIPTION OF THE INVENTION

Figure 1:
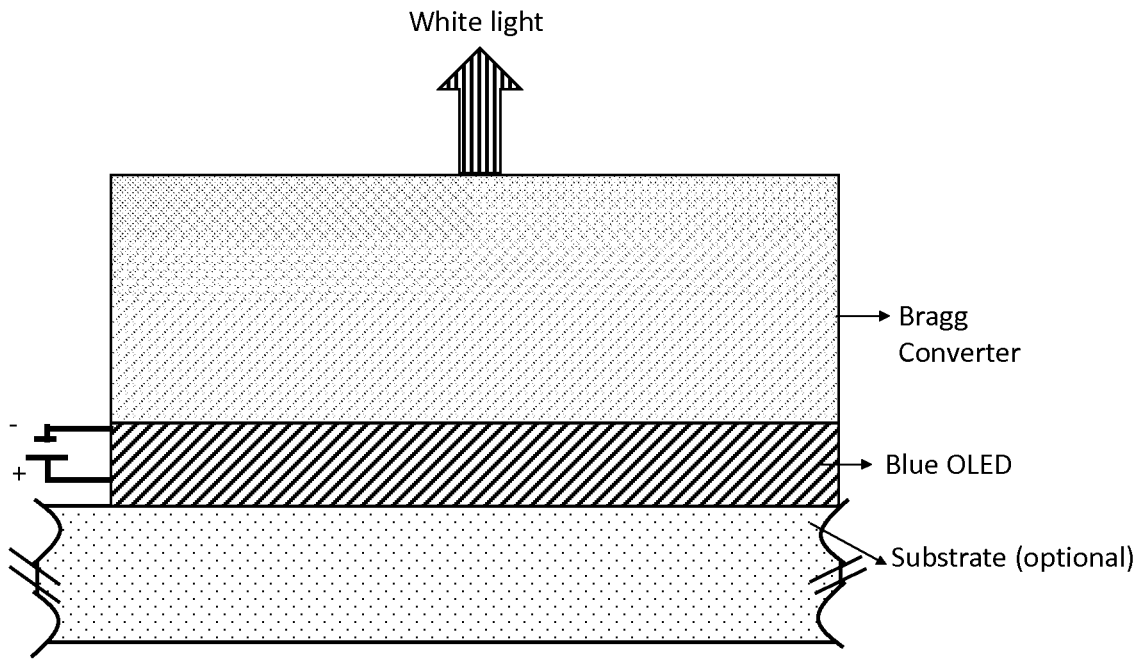
FIG. 1 is a schematic description of the principle of a WOLED according to the present invention.

In one embodiment, the target of the invention was to develop a novel white organic light emitting device (WOLED) based on a single electroluminescent layer producing single-colored light and a Bragg converter that converts the one-color electroluminescence into multi-colored exiting electroluminescence. In the specific application of using OLED-based devices for illumination, white light is desired.

In one embodiment of the present invention, it was surprisingly found that white light can be generated from a top-emitting OLED (TOLED) consisting of a sub-100 nm-thick blue single emitting layer (s-EML) coupled to the photonic Bragg modes of a dielectric distributed Bragg reflector (DBR). Bragg modes are the modes that lay outside the stop band of a DBR and whose wavelengths are defined by the length of the DBR in the direction of the periodic layer structure. It was also found that Bragg modes with resonances at the main white light colors, red-green-blue (RGB), can modify the optical transition density of states and produce broadband white light emission, despite being located outside the DBR photonic band.

In one embodiment of a WOLED according to the present invention, the DBR stopband is not used as a conventional cavity mirror, instead it suppresses UV radiation while enhancing outcoupling of the red-shifted emission. Moreover, by deposition of the DBR on top of the OLED, it is possible to achieve protection of the organic layers, leading to an increased lifetime for the final product.

As used herein, the expression "Bragg converter" refers to a periodic structure that converts light emitted from an OLED to light of a different color. In one embodiment, the Bragg converter converts the light from the OLED to a different color by blocking part of the radiation by its stop band and out-coupling through Bragg modes the wavelengths needed for the chosen color. In one embodiment of the present invention, the Bragg converter refers to a distributed Bragg reflector (DBR) used for blocking part of the radiation by its stop band (such as ultraviolet radiation) and for outcoupling through Bragg modes the wavelengths needed for the chosen color. In one embodiment, the Bragg converter comprises alternating layers of high refractive index material and low refractive index material. In a specific embodiment of the present invention, the Bragg converter comprises transparent layers of two materials with alternating high and low refractive indexes and supports multiple transparency Bragg modes in the visible spectrum (400 nm-700 nm).

In one embodiment of the present invention, the desired exiting light from the WOLED comprising a Bragg converter is multi-colored light. In another embodiment of the present invention, the desired exiting light from the WOLED comprising a Bragg converter is white light.

As used herein, the expression "white light" refers to light with a color temperature in the range 2700 K to 6500 K.

In one embodiment of the present invention, the WOLED comprises an organic light-emitting device (OLED) and a Bragg converter disposed immediately adjacent to the OLED.

In one embodiment, the WOLED comprises an organic light-emitting device (OLED), which comprises an electroluminescent medium (ELM), and a Bragg converter, which comprises pairs of alternating layers of high refractive index material and low refractive index material, and which is disposed immediately adjacent to the OLED, wherein the ELM comprises a single organic light emitting layer (EML) and the Bragg converter converts the light from the OLED to a different color by blocking part of the radiation by its stop band and out-coupling through Bragg modes the wavelengths needed for the chosen color.

FIG. 1 presents a schematic diagram of the WOLED according to the present invention. A WOLED according to the present invention comprises an electroluminescence-providing medium (electroluminescent medium, ELM). In one embodiment of the present invention, the ELM is sandwiched between an anode and a cathode. The WOLED further comprises a Bragg converter disposed on the side of the device on which the cathode is situated. Optionally, a WOLED according to the present invention may be disposed on a suitable optically flat solid substrate.

In one embodiment of the present invention, the ELM comprises an organic light-emitting layer (EML). In another embodiment of the present invention, the ELM comprises an EML, a hole injection layer, a hole blocking layer and an electron injection layer. In one embodiment of the present invention, the light-emitting layer and hole blocking layer together form a bilayer organic stack.

With respect to the direction of electroluminescence (as indicated by the arrow in FIG. 1 and FIG. 4), in one embodiment of the present invention, the Bragg converter is disposed on the top side, i.e. on the light-exiting face of the OLED. In one embodiment of the present invention, the Bragg converter is disposed immediately adjacent to the OLED. In a specific embodiment of the present invention, the Bragg converter is in contact with the OLED.

In one embodiment of the present invention, the OLED comprises a bilayer organic stack comprising at least two layers of organic components. In a specific embodiment of the present invention, the organic layers are a hole blocking layer (HBL) and a light-emitting layer (EML). In one embodiment of the present invention, the light emitting layer (EML) is free of dopants and other additives.

In one embodiment of the present invention, the OLED comprises a cathode, an electron injection layer, a bilayer organic stack, a hole injection layer, and an anode.

In one embodiment of the present invention, the OLED comprises a cathode, an electron injection layer, a hole blocking layer, a light emitting layer, a hole injection layer, and an anode.

In one embodiment of the present invention, the electroluminescent medium (ELM) comprises an electron injection layer, a bilayer organic stack, and a hole injection layer.

The color of the OLEDs and WOLEDs according to the present invention are defined according to the CIE 1931 XYZ color space as pairs of coordinates as defined by the Commission Internationale de l'Eclaraige (CIE).

In one embodiment of the present invention, the bilayer organic stack comprises a light-emitting layer and a hole blocking layer. In a specific embodiment of the present invention, the bilayer organic stack comprises an oligofluorene as a light-emitting layer and a phenanthroline as a hole blocking layer. In a very specific embodiment of the present invention the bilayer organic stack comprises layers of 2,7-bis[9,9-di(4-methylphenyl)-fluoren-2-yl]-9,9-di(4- methylphenyl) fluorene (TDAF) as an active organic layer and the hole-blocking layer comprises 4,7-diphenyl-1,10-phenanthroline (BPhen).

In one embodiment of the present invention, the bilayer organic stack is essentially free of dopants and other additives.

In one embodiment of the present invention, the emission layer has a thickness of 1 nm to 100 nm, 10 nm to 90 nm, 20 nm to 80 nm, 30 nm to 70 nm, 40 nm to 60 nm, or 45 nm to 55 nm.

In one embodiment of the present invention, the emission layer has a thickness of less than 100 nm, less than 90 nm, less than 80 nm, less than 70 nm, less than 60 nm, or less than 55 nm.

In one embodiment of the present invention, the emission layer has a thickness of more than 1 nm, more than 10 nm, more than 20 nm, more than 30 nm, more than 40 nm, or more than 45 nm.

In one embodiment of the present invention, the hole blocking layer has a thickness of 1 nm to 70 nm, 1 nm to 60 nm, 2 nm to 50 nm, 5 nm to 40 nm, 10 nm to 30 nm, or 15 nm to 25 nm.

In one embodiment of the present invention, the hole blocking layer has a thickness of less than 70 nm, less than 60 nm, less than 50 nm, less than 40 nm, less than 30 nm, or less than 25 nm.

In one embodiment of the present invention, the hole blocking layer has a thickness of more than 1 nm, more than 2 nm, more than 5 nm, more than 10 nm, or more than 15 nm.

In a specific embodiment of the present invention, the emission layer has a thickness of 50 nm and the hole blocking layer has a thickness of 20 nm.

In one embodiment of the present invention, the TOLED comprising TDAF and BPhen emits blue light with coordinates (0.19,0.15) according to 1931 CIE (Comission Internationale de l'Eclairage) with the peak emission at 442 nm.

In one embodiment of the present invention, the EML emits light of a broad range with part of its emission located at ultraviolet and blue wavelengths.

In addition to the bilayer organic stack, the ELM also comprises an anode and a cathode between which the bilayer organic stack is sandwiched. The anode and cathode are selected from any suitable conducting materials.

The ELM may be constructed from any suitable combination of materials that, when current is applied, luminesce. As is readily apparent to one skilled in the art, the selection of materials for the ELM will depend on the color temperature of the light that is desired from the luminescence of the WOLED.

In one embodiment of the present invention, the cathode has a thickness of 0.1 nm to 70 nm, 1 nm to 60 nm, 2 nm to 50 nm, 5 nm to 40 nm, 10 nm to 30 nm, or 10 nm to 20 nm.

In one embodiment of the present invention, the cathode has a thickness of less than 70 nm, less than 60 nm, less than 50 nm, less than 40 nm, less than 30 nm, or less than 20 nm.

In one embodiment of the present invention, the cathode has a thickness of more than 0.1 nm, more than 1 nm, more than 2 nm, more than 5 nm, or more than 10 nm.

In one embodiment of the present invention, the anode has a thickness of 10 nm to 130 nm, 20 nm to 120 nm, 30 nm to 110 nm, 40 nm to 100 nm, 50 nm to 90 nm, or 60 nm to 80 nm.

In one embodiment of the present invention, the anode has a thickness of less than 130 nm, less than 120 nm, less than 110 nm, less than 100 nm, less than 90 nm, or less than 80 nm.

In one embodiment of the present invention, the anode has a thickness of more than 10 nm, more than 20 nm, more than 30 nm, more than 40 nm, more than 50 nm, or more than 60 nm.

In a specific embodiment of the present invention, the material of the cathode is aluminium and the thickness of the cathode is 10 nm. In a specific embodiment of the present invention, the material of the anode is aluminium and the thickness of the anode is 70 nm.

As will be readily understood by a person skilled in the art, the metallic anode will also function as a reflector that reflects light emitted from the ELM towards the surface of the OLED or WOLED. In one embodiment of the present invention, the OLED comprises a reflective layer disposed on one side of the ELM. In a specific embodiment of the present invention, the Bragg converter is disposed on the side of the ELM opposite to the reflective material. In another specific embodiment of the present invention, the anode comprises a reflective material.

In one embodiment of the present invention, the WOLED comprises a hole injecting layer sandwiched between the anode and the bilayer organic stack. In a specific embodiment of the present invention the hole injecting layer comprises $MoO_3$ (molybdenum trioxide) and has a thickness of approximately 5 nm.

In one embodiment of the present invention, the hole injecting layer has a thickness of 0.1 nm to 70 nm, 1 nm to 60 nm, 2 nm to 50 nm, 5 nm to 40 nm, 10 nm to 30 nm, or 15 nm to 25 nm.

In one embodiment of the present invention, the hole injecting layer has a thickness of less than 70 nm, less than 60 nm, less than 50 nm, less than 40 nm, less than 30 nm, or less than 25 nm.

In one embodiment of the present invention, the hole injecting layer has a thickness of more than 1 nm, more than 2 nm, more than 5 nm, more than 10 nm, or more than 15 nm.

In one embodiment of the present invention, the WOLED comprises an electron injecting layer sandwiched between the cathode and the bilayer organic stack. In a specific embodiment of the present invention, the electron injecting layer comprises LiF (lithium fluoride) and has a thickness of approximately 0.5 nm.

In one embodiment of the present invention, the hole injecting layer has a thickness of 0.1 nm to 7 nm, 0.2 nm to 6 nm, 0.3 nm to 5 nm, 0.4 nm to 4 nm, 0.3 nm to 3 nm, or 0.2 nm to 2 nm.

In one embodiment of the present invention, the hole injecting layer has a thickness of less than 7 nm, less than 5 nm, less than 4 nm, less than 3 nm, less than 2 nm, or less than 1 nm.

In one embodiment of the present invention, the hole injecting layer has a thickness of more than 0.1 nm, more than 0.2 nm, more than 0.3 nm, more than 0.4 nm, or more than 0.45 nm.

In one embodiment of the present invention, the total thickness of the ELM comprising the bilayer organic stack, the anode, the cathode, the electron injecting layer, and the hole injecting layer is approximately 160 nm.

In one embodiment of the present invention, the total thickness of the ELM comprising the bilayer organic stack, the anode, the cathode, the electron injecting layer, and the hole injecting layer is 50 to 500 nm, 75 nm to 450 nm, 100 nm to 350 nm, 125 nm to 250 nm, 130 nm to 200 nm, or 140 nm to 190 nm.

In one embodiment of the present invention, the total thickness of the ELM comprising the bilayer organic stack, the anode, the cathode, the electron injecting layer, and the hole injecting layer is less than 500 nm, less than 450 nm, less than 350 nm, less than 250 nm, less than 200 nm, or less than 190 nm.

In one embodiment of the present invention, the total thickness of the ELM comprising the bilayer organic stack, the anode, the cathode, the electron injecting layer, and the hole injecting layer is more than 50 nm, more than 75 nm, more than 100 nm, more than 125 nm, more than 130 nm, or more than 140 nm.

In one embodiment of the present invention, the WOLED comprises a substrate. The substrate can be any material chemically compatible with the adjacent layer that is sufficiently optically flat and robust to support the layer. Depending on the specific application, the substrate can be flexible or inflexible, transparent, semi-transparent or opaque, silicon-technology compatible and can have integrated circuitry. In specific embodiments of the present invention, the substrate may also function as a reflector. Non-limiting examples of material that may be used as substrates are metals, plastics, semiconductors and dielectrics such as glass, quartz, or sapphire. Non-limiting examples of suitable substrates are metal coated glass or silicon.

As used herein, the term "glass" refers to any material characterized or characterizable as glass. This includes, but is not limited to, materials such as soda-lime glass, soda-lime-silica glass, fused quartz, fused-silica glass, vitreous-silica glass, sodium borosilicate glass, pyrex, lead oxide glass, crystal glass, lead glass, aluminosilicate glass, germanium oxide glass, sapphire glass, and mixtures thereof.

In one embodiment of the present invention, the substrate is attached to the side of the OLED opposite to the Bragg converter.

In one embodiment of the present invention, the Bragg converter comprises alternating pairs of high and low refractive index materials. The selection of the materials used will depend on the precise nature of the conversion of wavelengths needed. The layers of high and low refractive index materials may be arranged in any order; either with the high refractive index layer disposed on top of the low refractive index layer or with the low refractive index layer disposed on top of the high refractive index layer.

Figure 2:
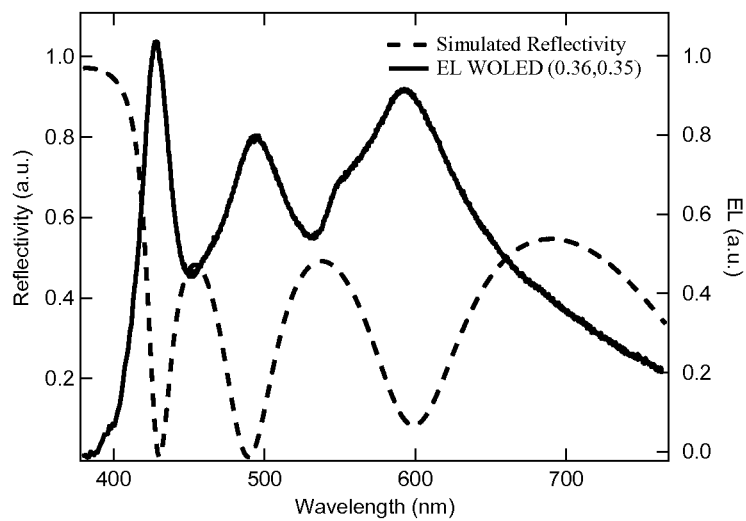
FIG. 2 shows the simulated reflectivity of the WOLED as well as the experimentally measured emission spectrum of the WOLED.

FIG. 2. shows the calculated reflectivity of the WOLED as well as the emission spectrum of the WOLED.

As used herein, the term "low refractive index material" refers to a material with a refractive index of 1.65 or lower for visible wavelengths and the term "high refractive index material" refers to a material with a refractive index of 1.7 or higher for visible wavelengths.

In a specific embodiment of the present invention, the Bragg converter comprises alternating layers of dielectric compounds selected from the group containing transparent oxides of silicon, tantalum, titanium, or hafnium. Non-limiting examples of suitable oxides include silicon oxides such as silica (silicon dioxide, $SiO_2$), tantalum oxides such as tantalum pentoxide ($Ta_2O_5$), titanium oxides such as titania ($TiO_2$), and hafnium oxides such as hafnium dioxide ($HfO_2$).

In one embodiment of the present invention, the thickness of individual layers of low refractive index material is 1 nm to 100 nm, 10 nm to 90 nm, 20 nm to 80 nm, 30 nm to 70 nm, 35 nm to 65 nm, or 40 nm to 60 nm.

In one embodiment of the present invention, the thickness of individual layers of low refractive index material is less than 100 nm, less than 90 nm, less than 80 nm, less than 70 nm, less than 65 nm, or less than 60 nm.

In one embodiment of the present invention, the thickness of individual layers of low refractive index material is more than 1 nm, more than 10 nm, more than 20 nm, more than 30 nm, more than 35 nm, or more than 40 nm.

In one embodiment on the present invention, the thickness of individual layers of low refractive index material is approximately 42 nm each. In another embodiment of the present invention, the thickness of individual layers of low refractive index material is approximately 53 nm each.

In one embodiment of the present invention, the low refractive index material is selected from the group containing transparent oxides of silicon. In a specific embodiment of the present invention, the low refractive index material is silica ($SiO_2$).

In one embodiment of the present invention, the thickness of the individual layers of high refractive index material is 10 nm to 200 nm, 40 nm to 150 nm, 50 nm to 130 nm, 60 nm to 120 nm, 70 nm to 110 nm, or 80 nm to 100 nm.

In one embodiment of the present invention, the thickness of the individual layers of high refractive index material is less than 70 nm, less than 60 nm, less than 50 nm, less than 40 nm, less than 30 nm, or less than 25 nm.

In one embodiment of the present invention, the thickness of the individual layers of high refractive index material is more than 1 nm, more than 2 nm, more than 5 nm, more than 10 nm, or more than 15 nm.

In one embodiment on the present invention, the thickness of the individual layers of high refractive index material is 41 nm each. In another embodiment on the present invention, the thickness of the individual layers of high refractive index material is 42 nm each.

In one embodiment of the present invention, the high refractive index material is selected from the group containing transparent oxides of tantalum, titanium, and hafnium. In a specific embodiment of the present invention, the high refractive index material is selected from the group containing transparent oxides of tantalum. In a very specific embodiment of the present invention, the high refractive index material is tantalum pentoxide ($Ta_2O_5$).

In one embodiment of the present invention, the thickness of a pair of high and low refractive index layers is 30 nm to 300 nm, 45 nm to 275 nm, 50 nm to 260 nm, 60 nm to 200 nm, 70 nm to 180 nm, or 80 nm to 110 nm.

In one embodiment of the present invention, the thickness of a pair of high and low refractive index layers is less than 300 nm, less than 200 nm, less than 160 nm, less than 100 nm, less than 120 nm, or less than 100 nm.

In one embodiment of the present invention, the thickness of a pair of high and low refractive index layers is more than 10 nm, more than 35 nm, more than 50 nm, more than 60 nm, more than 70 nm, or more than 80 nm.

In a specific embodiment on the present invention, the thickness of a pair of high and low refractive index layers is 83 nm. In another specific embodiment of the present invention, the thickness of a pair of high and low refractive index layers is 96 nm.

In one embodiment of the present invention the Bragg converter comprises at least one, at least two, at least three, at least four, or at least five layers each comprising a high refractive index layer and a low refractive index layer, disposed one upon the other. In a specific embodiment of the present invention, the Bragg converter comprises at least six layers each comprising a high refractive index layer and a low refractive index layer, disposed one upon the other.

In one embodiment of the present invention, the total thickness of the Bragg converter is 20 nm to 2000 nm, 30 nm to 1000 nm, 40 nm to 800 nm, 50 nm to 700 nm, 400 nm to 650 nm, or 500 nm to 600 nm.

In one embodiment of the present invention, the total thickness of the Bragg converter is less than 2000 nm, less than 1000 nm, less than 800 nm, less than 700 nm, less than 650 nm, or less than 600 nm.

In one embodiment of the present invention, the total thickness of the Bragg converter is more than 20 nm, more than 100 nm, more than 200 nm, more than 300 nm, more than 400 nm, or more than 500 nm.

In a specific embodiment of the present invention, the total thickness of the Bragg converter is approximately 498 nm. In another specific embodiment of the present invention, the total thickness of the Bragg converter is approximately 576 nm. The selection of thickness used will depend on the precise nature of the conversion of wavelengths needed.

It will be understood by one skilled in the art that the color of light emitted by the WOLED will depend on both the color emitted by the OLED and the structure of the Bragg converter. As a non-limiting example, it is submitted by the applicant that in one embodiment of the present invention, the WOLED comprising a blue OLED according to the present disclosure emitting light with 1931 CIE coordinates (0.19,0.15) encapsulated with a Bragg converter consisting of six layers each comprising a high refractive index layer and a low refractive index layer, disposed one upon the other with a total thickness of 498 nm emits uniformly white light with 1931 CIE coordinates (0.32,0.36). As another non-limiting example, it is submitted by the applicant that in one embodiment of the present invention, the WOLED comprising a blue OLED according to the present disclosure emitting light with 1931 CIE coordinates (0.19,0.15) encapsulated with a Bragg converter consisting of six layers each comprising a high refractive index layer and a low refractive index layer, disposed one upon the other with a total thickness of 576 nm emits uniformly white light with 1931 CIE coordinates (0.36,0.35).

Figure 3:
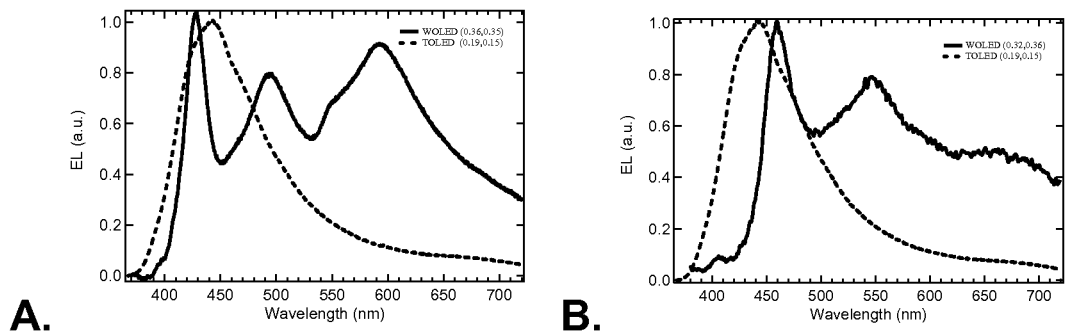
FIG. 3 shows the experimentally measured emission spectrum of the OLED as well as the experimentally measured emission spectrum from the two different WOLEDs.

FIG. 3 shows the experimentally measured emission spectrum of the OLED as well as the experimentally measured emission spectrum from the two different WOLEDs. FIG. 3A shows the emission spectrum of a WOLED comprises a Bragg converter with a total thickness of 498 nm and FIG. 3B the emission spectrum of a WOLED comprises a Bragg converter with a total thickness of 576 nm. In both cases the WOLED comprises an OLED emitting blue light with 1931 CIE coordinates (0.19,0.15).

In one embodiment of the present invention, the WOLED comprises an OLED and a Bragg converter. In a further embodiment, the WOLED comprises, an OLED, Bragg converter, and a substrate.

In one embodiment of the present invention the WOLED comprises an OLED and a Bragg converter wherein the OLED comprises an aluminium anode, a $MoO_3$ hole-injector, an oligofluorene emission layer, a BPhen (4,7-diphenyl-1,10-phenanthroline) hole blocking layer, a LiF electron injection layer and an aluminium cathode.

In one embodiment of the present invention the WOLED comprises an OLED and a Bragg converter wherein the OLED comprises an aluminium anode, a $MoO_3$ hole-injector, a TDAF (2,7-bis[9,9-di(4-methylphenyl)-fluoren-2-yl]-9,9-di(4-methylphenyl) fluorene) emission layer, a BPhen (4,7-diphenyl-1,10-phenanthroline) hole blocking layer, a LiF electron injection layer and an aluminium cathode.

Figure 4:
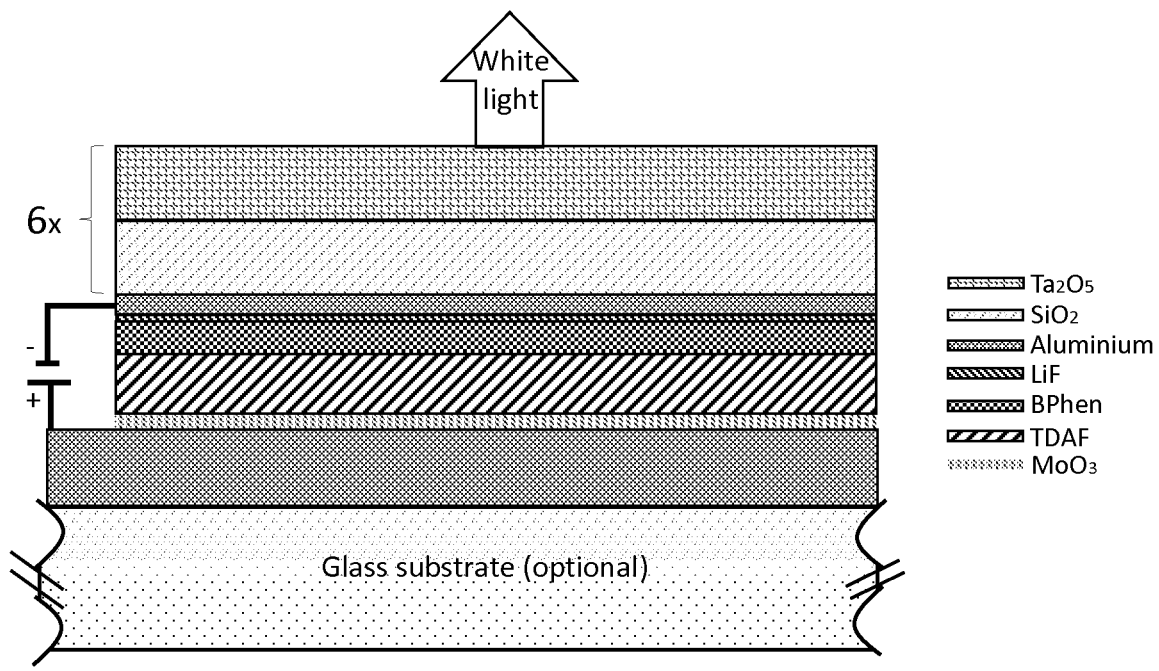
FIG. 4 is a schematic description of a WOLED according to the present invention.

In one embodiment of the present invention, the WOLED comprises an aluminium anode, a $MoO_3$ hole-injector, a TDAF (2,7-bis[9,9-di(4-methylphenyl)-fluoren-2-yl]-9,9-di(4-methylphenyl) fluorene) emission layer, a BPhen (4,7-diphenyl-1,10-phenanthroline) hole blocking layer, a LiF electron injection layer, an aluminium cathode, and a Bragg converter comprising alternating layers of $SiO_2$ and $Ta_2O_5$ according to FIG. 4.

In one embodiment of the present invention, the WOLED comprises an aluminium anode, a $MoO_3$ hole-injector, a TDAF (2,7-bis[9,9-di(4-methylphenyl)-fluoren-2-yl]-9,9-di(4-methylphenyl) fluorene) emission layer, a BPhen (4,7-diphenyl-1,10-phenanthroline) hole blocking layer, a LiF electron injection layer, an aluminium cathode, and a Bragg converter comprising alternating layers of $SiO_2$ and $Ta_2O_5$ according to FIG. 4 arranged on a substrate.

FIG. 4 is a schematic description of a WOLED according to the present invention.

In one embodiment of the present invention, the thickness of a WOLED according to the present invention is 150 nm to 1350 nm, 250 nm to 1250 nm, 350 nm to 1150 nm, 450 nm to 1050 nm, 550 nm to 950 nm, or 650 nm to 850 nm.

In one embodiment of the present invention, the thickness of a WOLED according to the present invention is less than 1350 nm, less than 1250 nm, less than 1150 nm, less than 1050 nm, less than 950 nm, or less than 850 nm.

In one embodiment of the present invention, the thickness of a WOLED according to the present invention is more than 150 nm, more than 250 nm, more than 350 nm, more than 450 nm, more than 550 nm, or more than 650 nm.

In a specific embodiment of the present invention, the total thickness of the WOLED comprising an emission layer, a cathode, an anode, a hole injecting layer, an electron injection layer and a Bragg converter is approximately 750 nm.

As will be understood by one skilled in the art, a WOLED according to the present invention may be manufactured in one of a number of different ways. Non-limiting examples of techniques for manufacturing a WOLED according to the present invention are vacuum deposition and spin coating.

In one embodiment of the present invention, the WOLED can be constructed by applying a mask to a suitable substrate or surface followed by sequential vacuum deposition of the material for the anode and the hole injection layer. After the deposition, vacuum is broken, the masking removed, and a second mask added perpendicular to the direction of the first mask. The organic bilayer, the electron injection layer and the cathode layer are finally added to complete the OLED. Once the deposition chamber has been vented to atmospheric conditions and the masking layer has been removed, the layers of the Bragg converter are added by sputtering in vacuum to finalize the WOLED.

In one embodiment of the present invention, the OLED-device may be replaced with an inorganic LED that is a colored inorganic semiconductor that, when combined with a Bragg converter, yields exiting light of a different color than that of the LED. For example, the colored inorganic semiconductors suitable for inclusion in the device include, but are not limited to, InGaN/GaN, ZnS, GaP:N, AlInGaP, GaAsP, GaAsP:N, InGaP, AlGaAs, and GaAs.

The WOLEDs of the present invention provide the additional advantage that the use of dielectric DBRs provide efficient encapsulation of the OLED, blocking diffusion of moisture and oxygen into the OLED thereby extending the lifetime of the device significantly. This means that encapsulation of the device by e.g. epoxying is not necessary.

One embodiment of the present invention is a method for producing white light with a WOLED according to the present invention by applying electricity to the WOLED.

In one embodiment of the present invention, the WOLED is used for producing white light.

EXAMPLES

The invention is described below with the help of examples. The examples are given only for illustrative purpose and they do not limit the scope of the invention.

Example 1: Method for Producing WOLED

The OLED fabrication was realized by using a standard vacuum evaporator with multiple deposition sources (Edwards E306). Deposition base pressure was approximately $10^{-6}$ mbar and the rate of deposition 2 Å s$^{-1}$. The OLEDs were deposited on quartz substrates with a thickness of 1 mm. The OLEDs were patterned in squares by using shadow masks directly in contact with the substrates. The bottom Al anode and $MoO_3$ hole injection layer were deposited first and the reactor vented to ambient atmosphere to change the mask. The top part of the OLED consisting of TDAF, Bphen, LiF and Al was deposited and then vented to atmospheric conditions before removing the mask. The Bragg converter was directly sputtered on the OLEDs.

Example 2: Characterization

A combination of ellipsometry (J. A. Woollam M2000) and profilometry (Bruker DektakXT) was used to determine the thin film thicknesses and obtain optical constants. All devices were electrically characterized with a Keithley source meter unit (2602B). The forward spectral radiance for increasing current was measured with an absolute calibrated 2D CCD camera (Pixis 400) coupled to a spectrometer (Acton SpectrPro 2500). The pixel on the spectrometer slit was directly imaged with an angular aperture of ±15 degrees and a magnification of 2.5. The angular-dependent electroluminescence of the devices was obtained by collecting the emission with an objective (10×, 0.3 NA) and by rotating the WOLED (OLED) at the optical axis with a goniometer. Back-focal plane objective images were then focused to a 200 μm spectrometer entrance slit. A vacuum micro-chamber that allows the rotation of the devices was developed in-house. All measurements were performed at a base pressure of $8\times10^{-2}$ mbar. To determine the external quantum efficiency (EQE), the known angle-resolved EL and forward spectral radiance to correct the measured photon number were parametrized. EQE is then the ratio of emitted photons to injected electrons.

Measurements showed that an OLED with thickness of approximately 160 nm produced according to the method of Example 1 disclosure emitted light with 1931 CIE coordinates (0.19,0.15) before encapsulation with a Bragg converter.

Encapsulation of the blue OLED with a Bragg converter to produce a WOLED with a total thickness of 498 nm yielded emitted white light with 1931 CIE coordinates (0.32,0.36) whereas a WOLED with a total thickness of 576 nm yielded emitted white light with 1931 CIE coordinates (0.36,0.35).

The invention claimed is:

1. A white organic light emitting device (WOLED) comprising
   an organic light-emitting device (OLED) comprising an electroluminescent medium (ELM), and
   a Bragg converter comprising pairs of alternating layers of high refractive index material and low refractive index material disposed immediately adjacent to the OLED,
   wherein the ELM comprises a single organic light emitting layer (EML) that emits light of a broad range with part of its emission located at ultraviolet and blue wavelengths and the Bragg converter that converts the light from the OLED to a different color by suppressing UV radiation by its stop band and enhancing outcoupling of the red-shifted emission through Bragg modes.

2. The WOLED of claim 1, wherein the ELM comprises a reflective layer disposed on one side of the EML.

3. The WOLED of claim 2, wherein the Bragg converter is arranged on the side of the ELM opposite to the reflective layer.

4. The WOLED of claim 1, wherein the emitting part of the OLED comprises an anode, an electron injection layer, a light emitting layer, a hole blocking layer, a hole injection layer and a cathode.

5. The WOLED of claim 1, wherein the Bragg converter comprises transparent oxides of dielectric materials such as oxides of silicon, tantalum, titanium, hafnium, or mixtures thereof.

6. The WOLED of claim 5, wherein the Bragg converter comprises oxides of silicon or tantalum such as silica and tantalum pentoxide.

7. The WOLED of claim 2, wherein the WOLED may optionally be arranged on a substrate disposed below the reflective layer.

8. The WOLED of claim 7, wherein the substrate may be any optically flat solid material onto which the reflective layer can be deposited.

9. The WOLED of claim 7, wherein the substrate is attached to the side of the OLED opposite to the Bragg converter.

10. The WOLED of claim 1 comprising an aluminium anode, a $MoO_3$ hole-injector, a TDAF (2,7-bis [9,9-di (4-methylphenyl)-fluoren-2-yl]-9,9-di(4-methylphenyl) fluorene) emission layer, a BPhen (4,7-diphenyl-1,10-phenanthroline) hole blocking layer, a LiF electron injection layer, an aluminium cathode, and a Bragg converter comprising alternating layers of $SiO_2$ and $Ta_2O_5$.

11. A process for the production of a WOLED of claim 1, said process comprising the steps of
   a. sequentially depositing the anode and hole injecting layers through a patterned shadow mask,
   b. sequentially depositing the light emitting layer, the hole blocking layer, the electron injection layer, and the cathode layer through a patterned shadow mask, and
   c. direct sputtering of the Bragg converter layers onto the surface of the cathode through a patterned shadow mask.

12. A method for producing white light with a device comprising a WOLED of claim 1.

* * * * *